United States Patent
Agrawal (10) Patent No.: US 9,385,708 B2
(45) Date of Patent: Jul. 5, 2016

(54) METHODOLOGY TO AVOID GATE STRESS FOR LOW VOLTAGE DEVICES IN FDSOI TECHNOLOGY

(71) Applicant: STMicroelectronics International N.V., Amsterdam (NL)

(72) Inventor: Ankit Agrawal, India (IN)

(73) Assignee: STMicroelectronics International N.V., Amsterdam (NL)

( * ) Notice: Subject to any disclaimer, the term of this patent is extended or adjusted under 35 U.S.C. 154(b) by 128 days.

(21) Appl. No.: 14/216,701

(22) Filed: Mar. 17, 2014

(65) Prior Publication Data

US 2015/0263726 A1 Sep. 17, 2015

(51) Int. Cl.
| | |
|---|---|
| *H01L 27/12* | (2006.01) |
| *H01L 29/786* | (2006.01) |
| *H03K 3/00* | (2006.01) |
| *H03K 17/687* | (2006.01) |
| *H03K 17/10* | (2006.01) |
| *H01L 29/10* | (2006.01) |
| *H01L 29/423* | (2006.01) |
| *H01L 27/092* | (2006.01) |

(52) U.S. Cl.
CPC ........ *H03K 17/6872* (2013.01); *H01L 27/1203* (2013.01); *H01L 29/1033* (2013.01); *H01L 29/42364* (2013.01); *H03K 17/102* (2013.01); *H01L 27/092* (2013.01)

(58) Field of Classification Search
None
See application file for complete search history.

(56) References Cited

U.S. PATENT DOCUMENTS

| | | | | |
|---|---|---|---|---|
| 5,892,260 | A * | 4/1999 | Okumura | H01L 27/0218 257/347 |
| 6,107,663 | A * | 8/2000 | Noble | H01L 21/823807 257/351 |
| 6,441,663 | B1 * | 8/2002 | Chuang | H03K 3/3565 327/206 |
| 6,635,518 | B2 * | 10/2003 | Aipperspach | H01L 27/1203 257/347 |
| 7,732,864 | B2 * | 6/2010 | Kawahara | H01L 27/1203 257/206 |
| 7,847,616 | B2 * | 12/2010 | Hashimoto | H01L 27/0627 257/351 |
| 8,890,247 | B2 * | 11/2014 | Bedell | H01L 21/76898 257/347 |
| 9,029,951 | B2 * | 5/2015 | Horita | G11C 11/412 257/347 |
| 2002/0038888 | A1 * | 4/2002 | Kadowaki | G04G 19/06 257/347 |
| 2004/0196089 | A1 * | 10/2004 | O'Donnell | H03K 17/165 327/437 |
| 2006/0232313 | A1 * | 10/2006 | Favard | H03K 3/3565 327/205 |
| 2007/0146953 | A1 * | 6/2007 | Ono | H01L 27/0255 361/100 |
| 2013/0020644 | A1 * | 1/2013 | Horita | G11C 11/412 257/351 |
| 2015/0263707 | A1 * | 9/2015 | Kumar | H03K 3/3565 327/205 |

OTHER PUBLICATIONS

Filanovsky, I.M. et al. "CMOS Schmitt Trigger Design" IEEE Transactions on Circuits and Systems, vol. 41, No. 1, pp. 46-49, 1994.

\* cited by examiner

*Primary Examiner* — Hoang-Quan Ho
(74) *Attorney, Agent, or Firm* — Seed IP Law Group PLLC (57) ABSTRACT

An inverter is implemented in an FDSOI integrated circuit die. The inverter includes a PMOS transistor and an NMOS transistor. The PMOS and NMOS transistors each include a first gate coupled to the respective source terminal of the transistor. The PMOS and NMOS transistors each include a back gate coupled to the input of the inverter.

20 Claims, 6 Drawing Sheets

METHODOLOGY TO AVOID GATE STRESS FOR LOW VOLTAGE DEVICES IN FDSOI TECHNOLOGY

BACKGROUND

1. Technical Field

The present disclosure is related to the field of integrated circuit dies. The present disclosure is related more particularly to inverter circuits implemented in integrated circuit dies.

2. Description of the Related Art

As integrated circuit die technology advances to further and further technology nodes, the gate oxide thickness of MOS transistors continues to shrink. As the gate oxide thickness of MOS transistors shrinks, so does the maximum voltage which can appear across the terminals of the transistors. At or below the 64 nm technology node, CMOS transistors typically cannot tolerate greater than 2 V across the source and drain or gate and source terminals. If too high a voltage is applied between the terminals of CMOS transistor, the functionality of the transistor can be destroyed. Various protection schemes are commonly implemented within circuits in order to avoid the possibility that the voltage overload occurs across the terminals of sensitive CMOS transistors.

Figure 1:
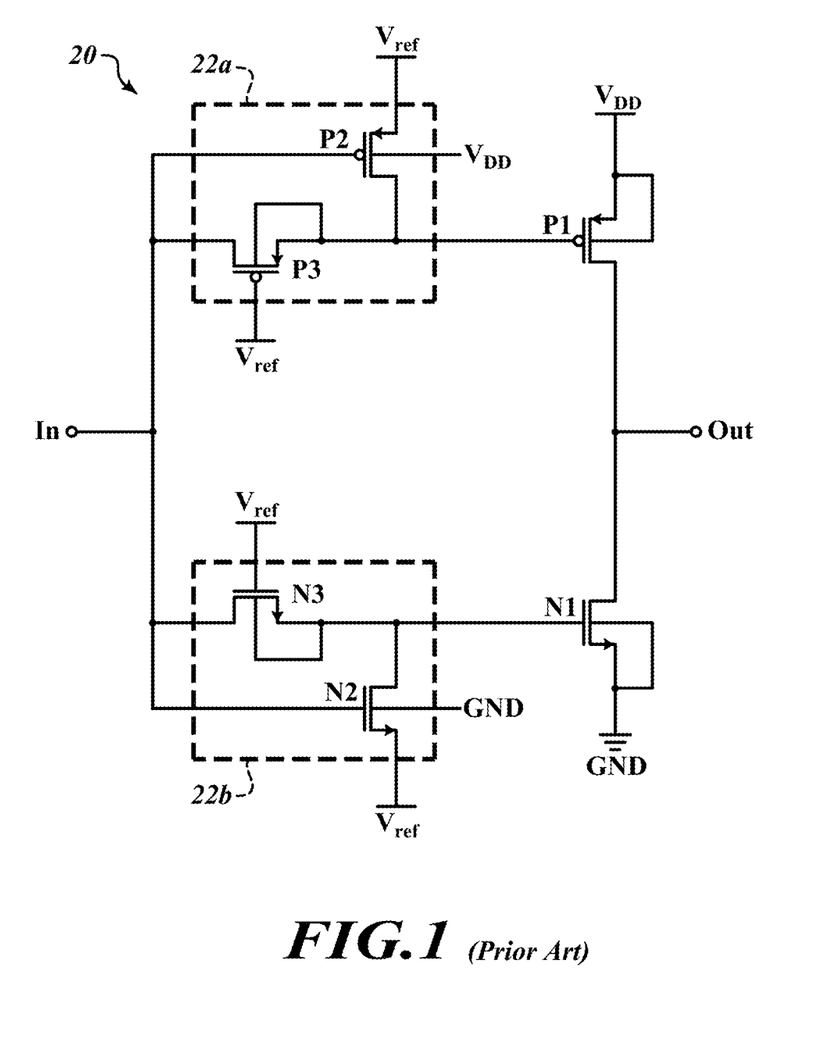
FIG. 1 is a schematic diagram of a known inverter.

FIG. 1 is a schematic diagram of a known inverter circuit implemented at the 64 nm node or smaller. The inverter circuit includes a PMOS transistor P1 and an NMOS transistor N1. The PMOS transistor P1 has a source terminal and a bulk terminal connected to VDD. The NMOS transistor N1 has a source and a bulk terminal connected to ground. The drains of the transistors N1 and P1 are connected to each other at the output Out of the circuit. Due to the thinness of the gate oxide of the transistors N1 and P1, it is important to protect the transistors P1 and N1 from receiving too high a gate-to-source voltage. To this end, the inverter 20 includes a first protection circuit 22a and a second protection circuit 22b. The first protection circuit 22a is coupled between the input In of the inverter and the gate of the transistor P1. The protection circuit 22a includes a PMOS transistor P2 and a PMOS transistor P3. The gate of the PMOS transistor P2 is coupled to the input In. The source of the transistor P2 is coupled to a reference voltage Vref. The voltage Vref is between VDD and GND. The drain of the transistor P2 is coupled to the gate of the transistor P1. The gate of the transistor P3 is coupled to the reference voltage Vref. The drain of the transistor P3 is coupled to the input In. The source of the transistor P3 is coupled to the gate of the transistor P1.

The second protection circuit 22b is similar to the first protection circuit 22a. The second protection circuit 22b is coupled between the input In of the inverter 20 and the gate of the transistor N1. The protection circuit 22b includes an NMOS transistor N2 and an NMOS transistor N3. The gate of the NMOS transistor N2 is coupled to the input In. The source of the transistor N2 is coupled to a reference voltage Vref. The drain of the transistor N2 is coupled to the gate of the transistor N1. The gate of the transistor N3 is coupled to the reference voltage Vref. The drain of the transistor N3 is coupled to the input In. The source of the transistor N3 is coupled to the gate of the transistor N1. The protection circuits 22a, 22b help to limit the gate voltage on the transistors P1 and N1 to the stress ceiling of the device.

When the input In is high the transistor P2 is turned off. The transistor P3 is conducting because the gate of the transistor P3 is tied to the lower reference voltage. The gate of the transistor P1 therefore receives the high voltage from the input In and is rendered nonconducting. But because the transistor P1 is not conducting, the output Out is blocked from the voltage VDD. While the input In is high, the transistor N2 is rendered conducting. The Vref is therefore applied to the gate of the transistor N1. The transistor N1 is therefore conducting. The output Out is connected to the ground voltage GND. When the input In is low, the transistor N2 is turned off, thereby shielding the transistor N1 from the high reference voltage. The transistor N3 is conducting and the gate of the transistor N1 receives the low voltage of In on its gate terminal. The transistor N1 is therefore turned off and the output Out is disconnected from ground. While the input In is low, the transistor P2 is turned on. The gate of the transistor P1 receives the Vref through the transistor P2. The Vref for the P-channel transistors may or may not be the same as the Vref for the N-channel transistors. Thus one may be low Vref and the other high Vref. The protection circuit 22a ensures that the gate of the transistor P1 does not receive a voltage lower than the low reference voltage. The protection circuit 22b ensures that the gate of the transistor N1 does not receive a voltage higher than the high reference voltage.

Figure 2:
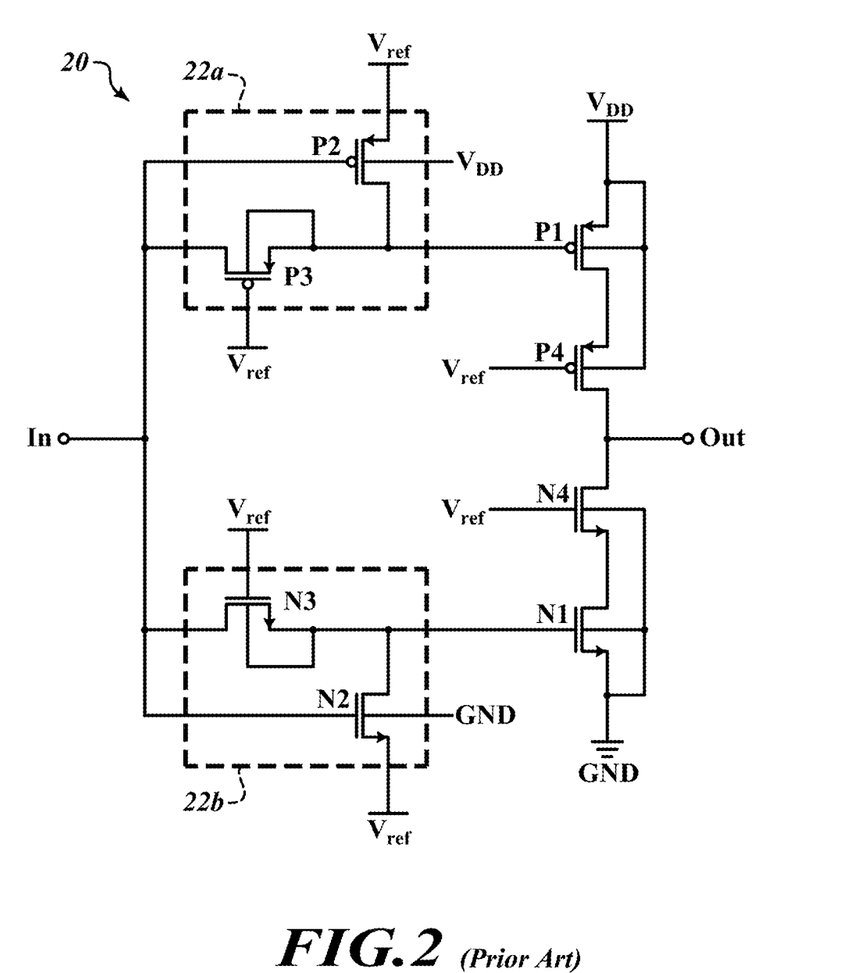
FIG. 2 is a schematic diagram of a known inverter.

FIG. 2 is a schematic diagram of a known inverter 20 implemented in a circuit in which a supply voltage of 3.3 V is present. The known inverter 20 FIG. 2 is essentially identical to the inverter 20 of FIG. 1 except that the PMOS transistor P4 is coupled between the transistor P1 and the output Out. An NMOS transistor N4 is coupled between the transistor N1 and the output Out. The transistor P4 receives on its gate the low reference voltage. The transistor N4 receives on its gate the high reference voltage. The transistors P4 and N4 are always on.

The inverters of FIGS. 1 and 2 have the drawback that they must be protected from high voltages by the protection circuits 22a, 22b. Protection circuits 22a, 22b introduce four additional transistors into the inverter 20. Thus the inverters of FIGS. 1 and 2 consume a large amount of area of the semiconductor substrate in order to accommodate the additional transistors of the protection circuits 22a, 22b. Even with the presence of these two protection circuits 22a, 22b, it is still possible for the transistors P1 and N1 to be damaged by excessive gate voltages when spikes appear in the prior art supply voltage.

BRIEF SUMMARY

One embodiment is an inverter implemented in FDSOI technology. The inverter includes a PMOS transistor and an NMOS transistor coupled together. The PMOS and NMOS transistors each include a first gate coupled to the respective source terminals of the transistors. The PMOS and NMOS transistors each include a back gate connected together at the input of the inverter. The drains of the transistors are connected to each other at the output of the inverter.

In one embodiment, the channel region of the transistors are formed in a first semiconductor layer. The first gates are separated from the channel regions of the transistors by a thin gate dielectric according to typical practices. The back gates are formed in a second semiconductor layer separated from the first semiconductor layer by buried oxide layer. The buried oxide layers thicker than the gate dielectric. The buried oxide layer serves as a second gate dielectric separating the back gates from the respective channel regions.

By applying an input voltage to the back gates of the transistors, the output voltage having complementary level is output at the drains of the transistors. Because the buried oxide is thicker than a standard gate dielectric, the transistors can withstand higher voltages being applied on the back gates. In one embodiment, additional protection circuits are not present because the back gates of the transistors can withstand higher voltages. Thus, due to the presence of the back gates, the inverter according to one embodiment takes up less area and can withstand higher voltages than conventional inverters.

DETAILED DESCRIPTION

Figure 3:
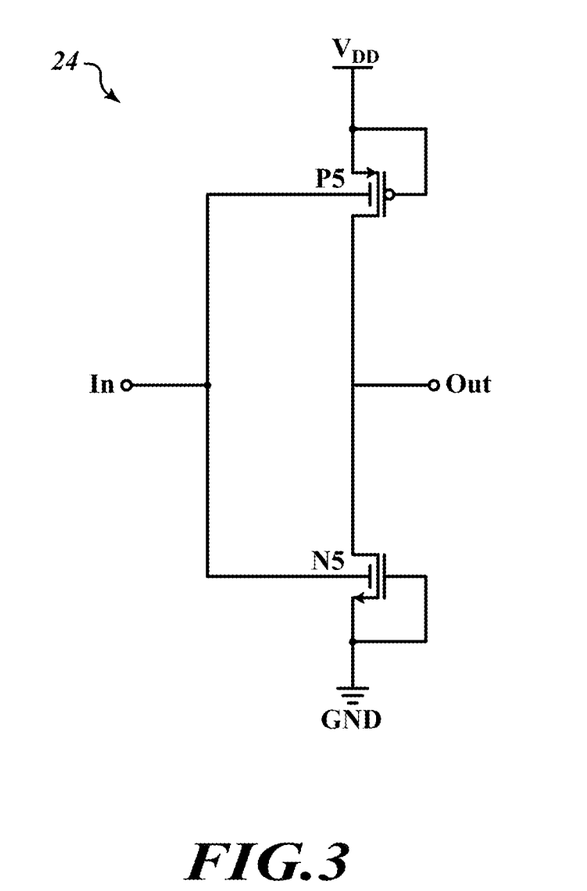
FIG. 3 is an inverter according to one embodiment.

FIG. 3 is a schematic diagram of an inverter 24 according to one embodiment. The inverter 24 includes a PMOS transistor P5 and an NMOS transistor N5. The gate of the transistor P5 is connected to the source of the transistor P5. The gate of the transistor N5 is connected to the source of the transistor N5. The source of the transistor P5 is connected to VDD. The source of the transistor N5 is connected to ground. The transistors P5 and N5 of the inverter 24 are implemented in FDSOI technology. Because the transistors P5 and N5 are implemented in FDSOI technology, the transistors P5 and N5 each include a back gate. The back gates of the transistors P5 and N5 are connected to the input In of the inverter 24. The drain terminals of the transistors P5 and N5 are connected to the output Out of the inverter 24.

As will be described in more detail below in relation to FIG. 5, the FDSOI technology allows for the transistors N5 and P5 to include back gates. The channel regions of the transistors N5 and N5P5 are positioned in a first semiconductor layer. In some embodiments, this channel semiconductor is thin. The gate electrodes of the transistors N5 and P5 are separated from the channel region by a thin gate dielectric. The back gates of the transistors P5 and N5 are implemented in a second semiconductor layer separated from the first semiconductor layer by a buried oxide layer. The buried oxide layer acts as a second gate dielectric separating the channel region from the back gates in the second semiconductor layer. Because the first semiconductor layer is so thin, the channel regions include substantially the entire thickness of the first semiconductor layer in the respective positions. The back gates of the transistors N5 and P5 correspond to heavily doped regions of the second semiconductor layer which are rendered conductive by the heavy doping. When a voltage is applied to the back gates, the transistors N5 and P5 can be rendered conductive in a similar manner as standard single gate devices. However, because the buried oxide layer is far thicker than a typical gate dielectric, higher voltages can be applied to the back gates of the transistors P5 and N5 without damaging the device. Hence, the protection devices 22a, 22b of FIG. 1 and two may be excluded from the inverter 24 without adversely affecting the functionality of the inverter 24.

The back gates of the transistors P5 and N5 are used as the primary gates of the transistors. The standard gates of the transistors P5 and N5 are connected as bulk connections would be in typical bulk CMOS devices. Most commonly in bulk CMOS devices, the bulk terminal of a PMOS device is connected to the source of the PMOS device. Most commonly in bulk CMOS devices, the bulk terminal of an NMOS device is connected to the source of the NMOS device. In this fashion, the gates of the transistors P5 and N5 are connected to the respective source terminals as bulk terminals would be in standard CMOS devices. The back gates of the transistors P5 and N5 act as the primary gates.

In one embodiment, VDD for the inverter 24 of FIG. 3 is 1.8 V. Because the supply voltage VDD is relatively low, only two transistors are present in the inverter 24 of FIG. 3.

When the input In receives a high voltage, the PMOS transistor P5 is rendered nonconducting. The NMOS transistor N5 is rendered conducting. Thus the transistors P5 and N5 of FIG. 3 behave in a similar manner to standard CMOS transistors in that a high voltage to the back gate turns off the transistor P5 and a high voltage to the back gate turns on the transistor N5. With the transistor P5 rendered nonconducting, the output Out is electrically isolated from VDD. With the transistor N5 rendered conducting, the output Out is electrically connected to ground through the transistor N5. Thus, a high voltage on the input In will cause the inverter 24 to output a low voltage at the output Out.

When the input In receives a low voltage, the PMOS transistor P5 is rendered conducting. The NMOS transistor N5 is rendered nonconducting. Thus the transistors P5 and N5 of FIG. 3 behave in a similar manner to standard CMOS transistors in that a low voltage on the back gate turns on the transistor P5 and a low voltage on the back gate turns off the transistor N5. With the transistor P5 rendered conducting, the output Out is electrically connected to VDD through the transistor P5. With the transistor N5 rendered nonconducting, the output Out is electrically isolated from ground. Thus, a low voltage on the input In will cause the inverter 24 to output a high voltage at the output Out. Because the buried oxide layer, which acts as a gate dielectric for the back gates of the transistors P5 and N5, is much thicker than the gate dielectric for the standard gate electrodes of the transistors P5 and N5, the transistors P5 and N5 can withstand much higher voltages across the terminals. The inverter 24 of FIG. 3 therefore includes four fewer transistors than the inverter 20 of FIG. 2.

Figure 4:
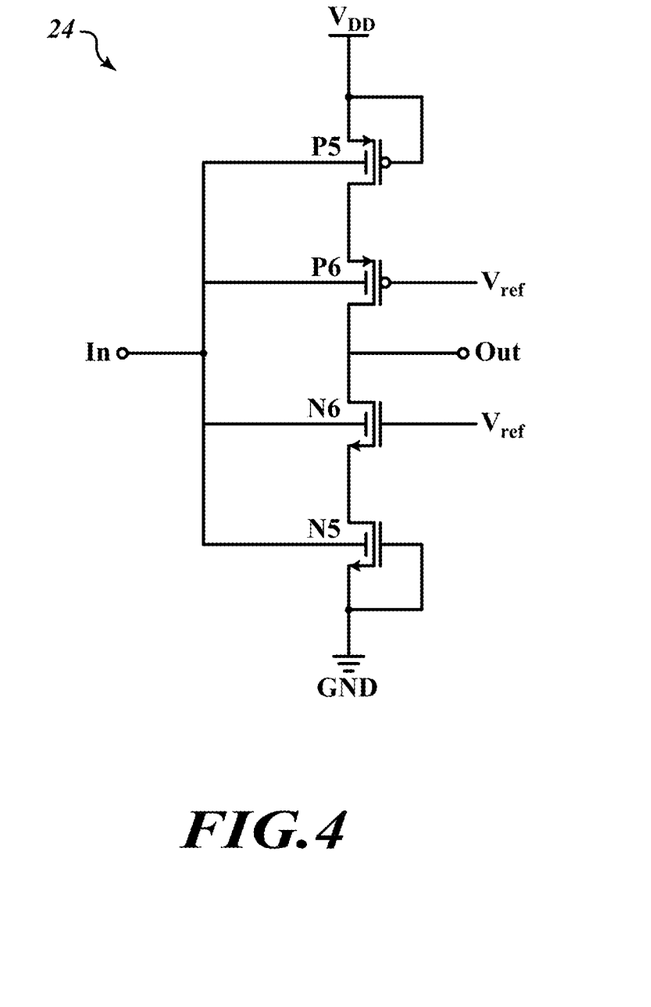
FIG. 4 is an inverter according to one embodiment.

FIG. 4 is a schematic diagram of an inverter 24 according to one embodiment. The inverter 24 of FIG. 4 is similar to the inverter 20 of FIG. 2 in that it can be used at a higher supply voltage VDD, for example 3.3 V or higher. The inverter 24 of FIG. 4 includes transistors P5 and N5 as described previously with respect to FIG. 3. The inverter 24 of FIG. 4 further includes a PMOS transistor P6 and an NMOS transistor N6 coupled between the transistors P5 and N5. The transistors P6 and N6 are coupled together at their drains to provide the output Out of the inverter 24. The source of the transistor P6 is coupled to the drain of the transistor P5. The source of the transistor N6 is coupled to the drain of the transistor N5. The transistors P6 and N6 each include standard front side transistor gates connected to respective reference voltages. The standard front side gate of the transistor P6 is connected to a low reference voltage. The standard front side gate of the transistor N6 is connected to a high reference voltage. The value Vref for the P and N channel transistors may be the same, but they are usually different, the P being lower and the N being high in some cases. The back gates of the transistors P6 and N6 are connected to the input In of the inverter 24. As described previously, the standard gate of the transistor P5 is connected to the source of the transistor P5. The standard gate of the transistor N5 is connected to the source of the transistor N5.

The presence of the transistors P6 and N6 also provides some protection to the inverter 24 against the higher voltages that may be present in the inverter 24. The transistor P6 ensures that a voltage smaller than the low-reference voltage will not appear across the terminals of the transistor P5. The presence of the transistor N6 ensures that a voltage greater than the high-voltage reference will not appear across the terminals of the transistor N5.

As described previously, the back gates of the transistors P5, P6, N5, N6 are separated from the respective channel regions by the buried oxide layer, which is much thicker than the standard gate dielectric. For this reason, higher voltages can be applied to the transistors P5, P6, N5, N6 without the need of the protection circuits 22a, 22b of FIG. 2.

The inverter 24 of FIG. 4 functions in substantially the same manner as the inverter 24 of FIG. 3. When a low voltage is applied to the input In, the low voltage on the back gates of the transistors P5, P6 render the transistors P5, P6 conducting, thereby electrically connecting the output Out to VDD. The low voltage on the back gates of the transistors N5, N6 renders the transistors N5, N6 nonconducting, thereby isolating the output Out from ground. A low voltage on the input In therefore results in a high voltage on the output Out.

When a high voltage is applied to the input In, the high voltage on the back gates of the transistors P5, P6 render the transistors P5, P6 nonconducting, thereby electrically isolating the output Out from VDD. The high voltage on the back gates of the transistors N5, N6 renders the transistors N5, N6 conducting, thereby electrically connecting the output Out to ground. A high voltage on the input In therefore results in a low voltage on the output Out.

Figure 5:
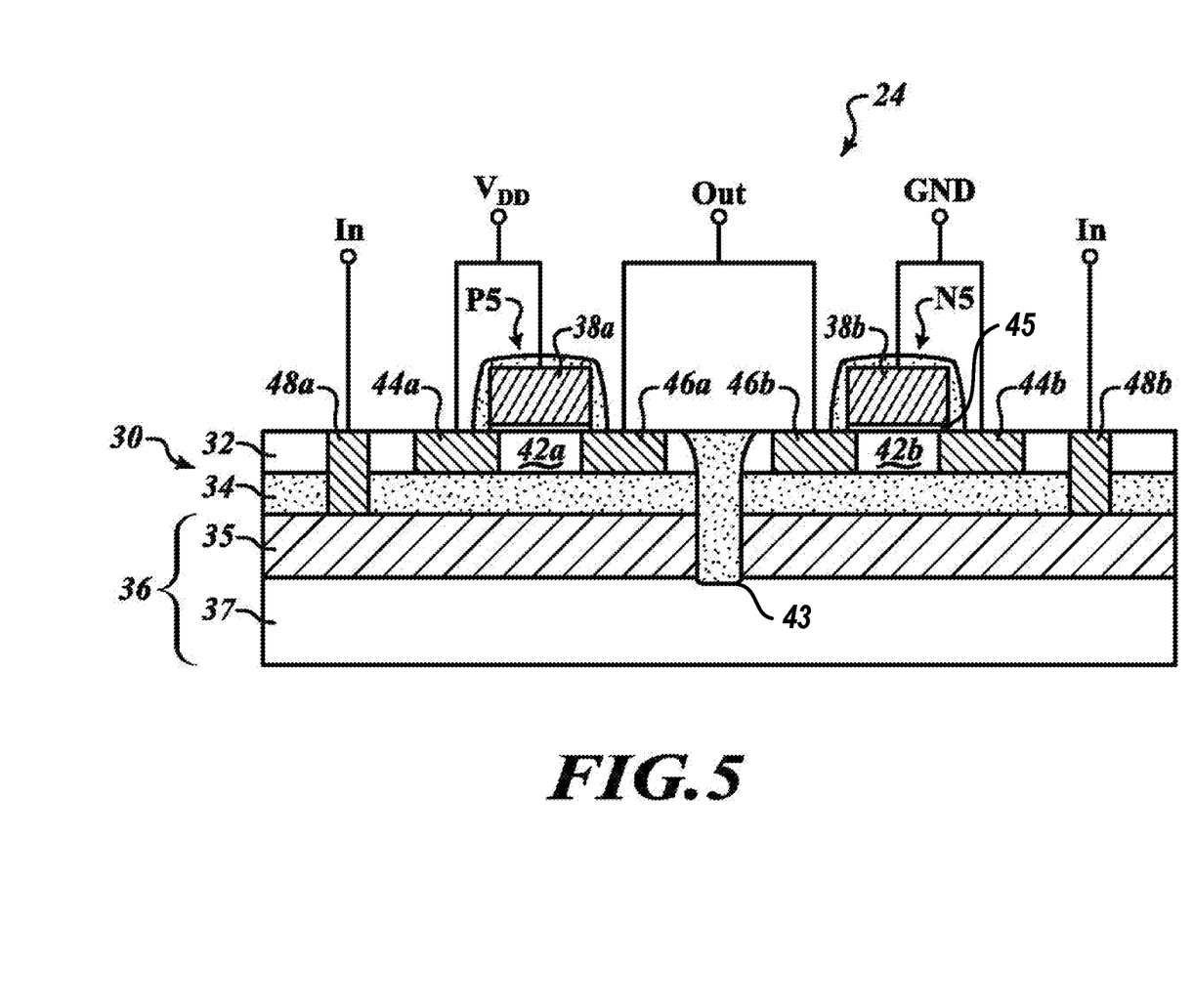
FIG. 5 is a cross section of an integrated circuit die including an inverter according to one embodiment.

FIG. 5 is a cross-section of an integrated circuit die 30 including the inverter 24 of FIG. 3. The integrated circuit die 30 includes a first semiconductor layer 32. The first semiconductor layer is for example between 2 and 10 nm thick. The first semiconductor layer 32 is positioned on a buried dielectric layer 34. The buried dielectric layer 34 is for example about 25 nm thick. The second semiconductor layer 36 is positioned below the buried dielectric layer 34. The second semiconductor layer 36 includes a heavily doped region 35 and an undoped or lightly doped region 37.

The semiconductor layer 32 includes the channel region 42a of the transistor P5 and the channel region 42b of the transistor N5, source regions 44a, 44b of the transistors P5, N5 and the drain regions 46a, 46b of the transistors P5, N5 are also positioned in the first semiconductor layer 32. The gate electrode 38a of the transistor P5 is separated from the channel region 42a by a gate dielectric 45, which is, for example, 3 nm thick or less. The gate electrode 38b of the transistor N6 is also separated from the channel region 42b by the gate dielectric 45. The gate electrode 38a of the transistor P5 is connected to the source terminal 44a of the transistor P5. The gate electrode 38b of the transistor N5 is connected to the source terminal 44b of the transistor N5. The source electrode 44a of the transistor P5 is coupled to VDD. The drain electrode 46a of the transistor P5 is coupled to the drain electrode 46b of the transistor N5. The source electrode 44b of the transistor N5 is connected to ground.

The heavily doped region 35 of the second semiconductor layer 36 includes the back gate of the transistors P5 and N6. The back gate of the transistor P6 and N6 are each coupled to the input In by the second gate contacts 48a, 48b respectively. The second gates in the heavily doped region 35 of the second semiconductor layer 36 are isolated from each other by trench isolation regions 43. The second gates are separated from the channel regions 42a, 42b by the buried oxide layer 34. The buried oxide layer 34 therefore acts as a second gate dielectric layer separating the channel regions 42a, 42b from the second gates.

The transistors P5 and N5 are implemented in FDSOI technology as stated previously. The channel regions 42a, 42b of the transistors P6 and N6 are fully depleted. This is in contrast to standard bulk MOS transistors or standard partially depleted SOI transistors.

In a standard bulk transistor, the semiconductor layer in which the channel region is located can be hundreds of nanometers thick. A charge depleted region forms below the channel region between the source and drain of the standard transistor. The channel region and the charge depleted region below it are typically only a few nanometers thick. Below the charge depleted region is an undepleted bulk semiconductor portion of the semiconductor layer. The bulk semiconductor portion below the channel region is typically at an unknown floating voltage.

A partially depleted SOI transistor differs from a bulk MOS transistor in that there exists a buried oxide (BOX) layer between the channel region and a bulk silicon substrate. A depletion region, depleted of charge, that forms below the channel region, between the source and drain regions, is bounded below by the BOX. The presence of the BOX prevents the substrate voltage from electrically influencing the channel. Otherwise, the extent of the depletion region depends on the relative dimensions of the various layers, as well as source and drain doping profiles. In the case of the partially depleted SOI device shown in the depletion region does not fill all of the material between the source and the drain, wherein an undepleted portion remains at an undetermined floating electric potential. The presence of the undepleted portion is generally undesirable because it is not well controlled, and yet the associated floating electric potential can electrically influence the channel and degrade the transistor performance.

A fully-depleted SOI (FDSOI) transistor such as P5 and N5 in FIG. 5 also has a BOX layer 34. However, the source and drain regions 44a, 44b, 46a, 46b of the FDSOI transistors P6 and N6 respectively, are shallower than the source and drain regions of a partially depleted SOI device. As a result, the doping profiles are effectively vertical, and the charge characteristics of the channel regions 42a, 42b can be set by the doping concentrations such that a fully charge-depleted region forms between the source and drain 44a, 44b, 46a, 46b, bounded below by the BOX 34, in response to application of a bias voltage to the gate 38a, 38b. Because all of the material between the source and drain is charge-depleted, the undepleted portion has been eliminated as a possible cause of transistor degradation.

As described previously with respect to FIG. 3, when the input In is low, the low voltage is applied to the back gates in the heavily doped region 35 of the second semiconductor layer 36 via the back gate contacts 48a, 48b. The back gates in the heavily doped semiconductor region 35 cause an electric field to affect the channel regions 42a, 42b of the transistors P5, N5. The low voltage on the input renders the channel region 42a of the PMOS transistor P5 conducting. This causes the output Out to be electrically connected to VDD through the transistor P5. The low voltage on the input In renders the channel region 42b of the NMOS transistor N5 nonconducting. This causes the output Out to be electrically isolated from ground.

As described previously with respect to FIG. 3, when the input In is high, the high voltage is applied to the back gates in the heavily doped region 35 of the second semiconductor layer 36 via the back gate contacts 48a, 48b. The back gates in the heavily doped semiconductor region 35 cause an electric field to affect the channel regions 42a, 42b of the transistors P5, N5. The low voltage on the input renders the channel region 42a of the PMOS transistor P5 nonconducting. This causes the output Out to be electrically isolated from VDD. The high voltage on the input In renders the channel region 42b of the NMOS transistor N5 conducting. This causes the output Out to be electrically connected to ground through the source 44b of the transistor N5.

Because the buried oxide layer 34 is much thicker than the gate dielectric separating the gate electrodes 38a, 38b from the channel regions 42a, 42b, the transistors P5, N5 can withstand much higher voltages on the back gates. This can allow for the exclusion of the protection circuits 22a, 22b of FIG. 1.

While not shown in the figures, the inverter 24 of FIG. 4 can be implemented in the integrated circuit die 30 in a substantially similar manner as the inverter 24 in the cross section of FIG. 5. In particular the transistors P6, N6 will be positioned between the transistors P5 and N5. Channel regions and sources and drains of the transistors P6, N6 would be implemented in the first semiconductor layer 32 in substantially the same manner as the channel regions 42a, 42b, source regions 44a, 44b, and drain regions 46a, 46b of the transistors P5, N5. The back gates of the transistors P6, N6 would be implemented in the highly doped region 35 of the semiconductor layer 36 in substantially the same manner as the back gates of the transistors P5, N5.

Those of skill in the art will understand that the transistors of the inverter 24 can be implemented in the FDSOI integrated circuit die 30 in a large variety of configurations in accordance with principles of the present disclosure. All such configurations fall within the scope of the present disclosure.

Figure 6:
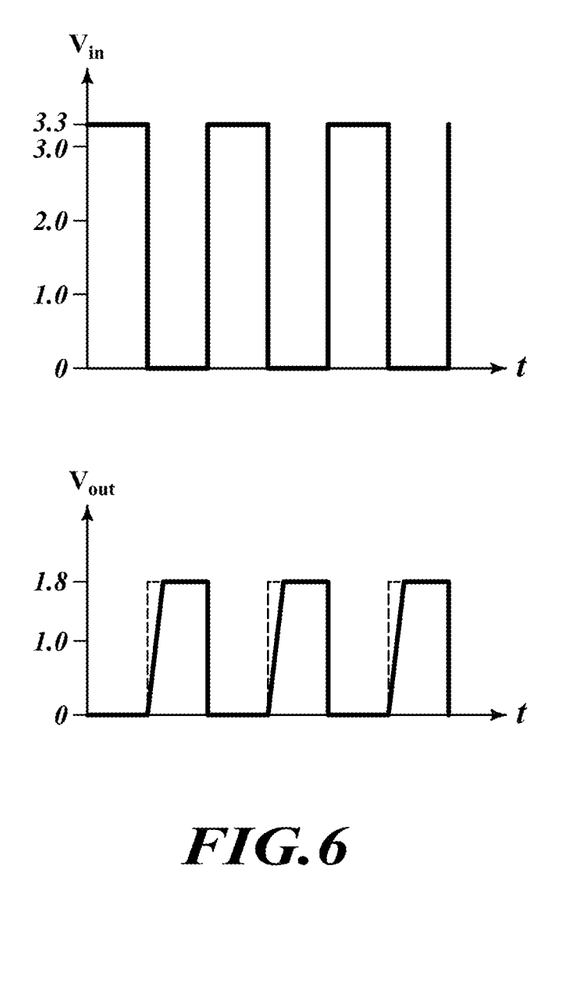
FIG. 6 is a graph of in input and output of an inverter according to one embodiment.

FIG. 6 is a graph of the voltages on the input In of the inverter 24 and the output Out of the inverter 24 of FIG. 3 according to one embodiment. When the input voltage is at the high voltage of 3.3 V, the output voltage is 0 V. When the input voltage goes low, the output voltage slews high to 1.8 V. When the input voltage goes high again, the output voltage goes to ground. As can be seen from the graph of FIG. 6, when the output voltage goes from low to high, the slew rate is slightly lower than the ideal inverter shown in dashed lines. Nevertheless, the inverter 24 functions very well as an inverter and can withstand higher voltages on the back gates.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
   a first semiconductor substrate;
   a dielectric layer on the first semiconductor substrate;
   a second semiconductor substrate on the dielectric layer and separated from the first semiconductor substrate by the dielectric layer;
   a gate dielectric layer on the second semiconductor substrate;
   a plurality of transistors each respectively including:
      a gate terminal on the gate dielectric layer and separated from the second semiconductor substrate by the gate dielectric layer;
      a channel region in the second semiconductor substrate below the gate terminal; and
      a source and drain region in the second semiconductor substrate, the source and the gate terminal being electrically connected;
   a voltage source coupled to the first semiconductor substrate and configured to turn the plurality of transistors on or off by applying a high voltage or a low voltage to the first semiconductor substrate.

2. The device of claim 1 wherein the plurality of transistors includes a PMOS transistor and an NMOS transistor.

3. The device of claim 2 wherein the drains of the PMOS and NMOS transistors are coupled together.

4. The device of claim 3 wherein the NMOS and PMOS transistors are an inverter, the drains of the NMOS and PMOS transistors being an output of the inverter, and the first semiconductor substrate is an input of the inverter.

5. The device of claim 1 wherein the channel regions of the plurality of transistors have a length less than or equal to 32 nm.

6. The device of claim 5 wherein at least one of the plurality of transistors is configured to operate with a drain to source voltage greater than or equal to 3 V.

7. The device of claim 1 comprising a data input pad electrically coupled to the first semiconductor substrate.

8. The device of claim 1 wherein the gate dielectric layer is less than 5 nm thick.

9. The device of claim 8 wherein the dielectric layer is greater than 15 nm thick.

10. An integrated circuit die comprising:
    a first semiconductor substrate;
    a dielectric layer on the first semiconductor substrate;
    a second semiconductor substrate on the dielectric layer and separated from the first semiconductor substrate by the dielectric layer;
    a gate dielectric layer on the second semiconductor substrate;
    a Schmitt trigger including:
       a gate terminal on the gate dielectric layer and separated from the second semiconductor substrate by the gate dielectric layer;
       a channel region in the second semiconductor substrate below the gate terminal; and
       a source and drain region in the second semiconductor substrate, the source and the gate terminal being electrically connected;
    a voltage source coupled to the first semiconductor substrate and configured to turn the transistors on or off by applying a high voltage or a low voltage to the first semiconductor substrate.

11. A digital circuit, comprising:
    a power supply;
    a plurality of dual gate transistors coupled in series between the power supply and a ground, each dual gate transistor having a source, a drain, a front side gate, and a back gate, source terminals of some of the transistors being coupled to their respective front side gates;
    an input coupled to all of the back gates; and
    an output coupled between at least two of the drains.

12. The circuit of claim 11 wherein the dual gate transistors are fully-depleted silicon-on-insulator (FDSOI) devices.

13. The circuit of claim 11 wherein a low voltage signal appears at the output of the digital circuit in response to a high voltage signal applied to the input, and a high voltage signal appears at the output in response to a low voltage signal applied at the input.

14. The circuit of claim 11 wherein a gate dielectric of the back gates is substantially thicker than a gate dielectric of the front side gates.

15. The circuit of claim 14 wherein the gate dielectric of the back gates is a buried oxide layer in a silicon substrate.

16. The circuit of claim 11 wherein the plurality of dual gate transistors includes a first PMOS transistor and a first NMOS transistor.

17. The circuit of claim 16, further comprising:
a second dual gate PMOS transistor and a second dual gate NMOS transistor coupled in series with the first dual gate transistors; and
a selected reference voltage coupled to front side gates of the second transistors,
wherein the input is further coupled to back gates of the second transistors; and wherein the output is coupled between drains of the second PMOS and NMOS transistors.

18. The circuit of claim 17 wherein a voltage of the power supply exceeds a breakdown voltage of the front side gates.

19. The circuit of claim 18 wherein the power supply voltage exceeds 3 V.

20. The circuit of claim 17 wherein two different reference voltages are coupled to the front side gates of the second PMOS and NMOS transistors.

\* \* \* \* \*